United States Patent [19]

Laug

[11] Patent Number: 4,965,529

[45] Date of Patent: Oct. 23, 1990

[54] HIGH CURRENT, VERY WIDE BAND TRANSCONDUCTANCE AMPLIFIER

[75] Inventor: Owen B. Laug, Barnesville, Md.

[73] Assignee: The United States of America as represented by the Secretary of Commerce, Washington, D.C.

[21] Appl. No.: 410,387

[22] Filed: Sep. 21, 1989

[51] Int. Cl.$^5$ .............................................. H03F 3/45
[52] U.S. Cl. ..................................... 330/255; 330/257
[58] Field of Search ................ 330/255, 257, 275, 295

[56] References Cited

U.S. PATENT DOCUMENTS

| | | | |
|---|---|---|---|
| 4,390,848 | 6/1983 | Blauschild | 330/151 |
| 4,528,515 | 7/1985 | Gross | 330/254 |
| 4,555,672 | 11/1985 | Segal | 330/255 |
| 4,580,106 | 4/1986 | Vittoz | 330/261 |
| 4,689,607 | 8/1987 | Robinson | 330/257 X |
| 4,723,110 | 2/1988 | Voorman | 330/252 |
| 4,797,629 | 1/1989 | Wildlar | 330/258 |
| 4,823,092 | 4/1989 | Pennock | 330/253 |

OTHER PUBLICATIONS

Feldman, "Anti-Negative Feedback for Hi-Fi Amplifiers", *Radio-Electronics*, vol. 52, No. 3, Mar. 1981, pp. 52–54.

*Primary Examiner*—James B. Mullins
*Attorney, Agent, or Firm*—Thomas Zack; Alvin J. Englert; Frank J. Kowalski

[57] ABSTRACT

A high-current, very-wide-band transconductance amplifier includes a differential voltage to current converter and a plurality of complementary unipolar current mirror cells. The differential voltage to current converter isolates the input voltage terminal from the common side of the output load current terminal. A plurality of positive current mirror cells are connected in parallel and a plurality of negative current mirror cells are connected in parallel to avoid the need for a single low resistance current sensing resistor and the fabrication problems inherent in such resistors.

14 Claims, 3 Drawing Sheets

TIME μS

HIGH CURRENT, VERY WIDE BAND TRANSCONDUCTANCE AMPLIFIER

BACKGROUND OF THE INVENTION

1. Field of the Invention

The present invention relates to transconductance amplifiers, and more particularly to high current transconductance amplifiers that are stable over a very wide bandwidth.

2. Related Prior Art

Transconductance amplifiers are widely used as a programmable source of current to calibrate meters, transformers, and shunts, in addition to experimental uses requiring a stable source of constant current. Such an amplifier ideally produces a current in a load proportional to an input voltage and maintains that current independent of the load impedance. There is an increasing need to provide calibrations of current transformers, meters, and shunts at current levels up to and even exceeding twenty amps rms at 100 kHz. Although commercial transconductance amplifiers exist which can deliver currents well in excess of twenty amps, they fail to provide such levels of current above just a few kHz. One of the main limitations to the conventional transconductance design approach is the current-sensing resistor, which for practical reasons, must be in the milli-ohm range for currents in the tens of amperes. Low-value shunt resistors of this order must be of special design to minimize reactance, deviation of resistance with frequency, and temperature effects of resistance.

Prior art has described a variety of fixed and controlled current sources implemented by combinations of monolithic and discrete components. Almost all transconductance amplifier designs or current sources rely on some type of current shunt to provide a voltage proportional to current which is used as feedback to compare it with an input voltage. The shunt must be properly designed to provide a voltage drop across it that is a true measure of the current through it over a wide frequency range with minimum phase shift. At low currents, rather ordinary commercial metal film resistors serve well. However, practical considerations dictate a low-value resistance shunt for high currents. Typically, a resistance of about five to ten milli-ohms is used for current levels in the twenty amp range. Low-value shunt resistors of this order must be of special design to minimize their reactance, deviation of resistance with frequency, and temperature coefficient of resistance. Although good low-value shunt resistors are achievable, they are often proprietary items and expensive because of the special design necessary.

SUMMARY OF THE INVENTION

The present invention overcomes current/frequency limitations by utilizing the inherent tendency for paralleled current mirrors to add currents so that the sum is independent of frequency, thus obviating the need for a single low-resistance high quality current shunt. The input and output of complementary unipolar current-mirror cells are paralleled. Each cell has a fixed current gain determined by the ratio of two resistors. A differential input voltage to current circuit drives the cell array. The design has the advantage of avoiding the need for a single low resistance current sensing resistor and the attendant problems inherent in such resistors. The present invention includes a modification of the basic idea of using complementary current sources or current mirrors with an operational amplifier to obtain a bipolar voltage controlled current source. A total of ten positive and ten negative current mirror cells each contribute to provide the total bipolar current at the output. This configuration has several advantages. The controlling device within each cell operates at one tenth the maximum peak output current rather than having a single stage power circuit to control the full output current. The total power is therefore dissipated evenly among the cells, allowing easier thermal management. Also, sharing the current by a number of cells has the main advantage of not requiring a single low-resistance shunt in the output circuit to sense the current. And finally, the bandwidth of the system is independent of the number of paralleled cells. Thus, the present invention overcomes the present current/frequency limitation and allows current calibrations to be made over a much broader range.

DESCRIPTION OF THE PREFERRED EMBODIMENT

Figure 1:
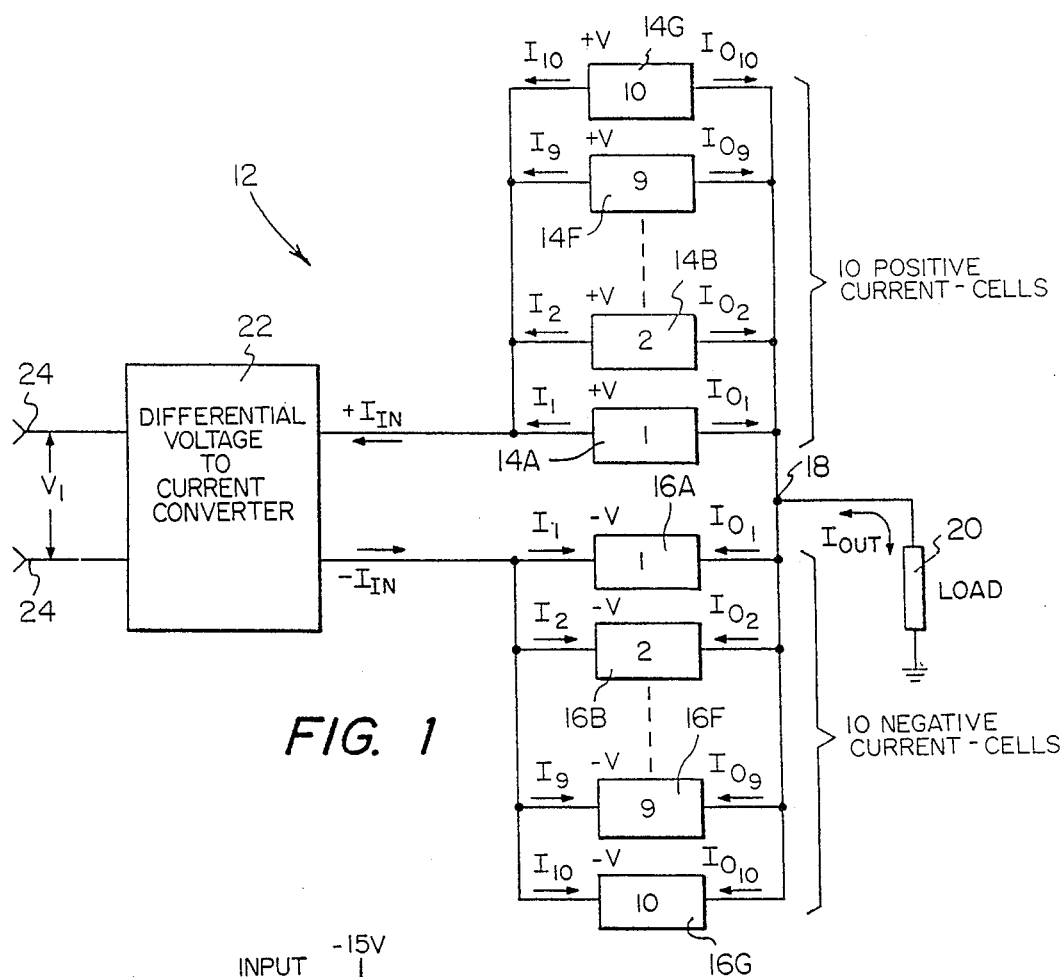
FIG. 1 is a block diagram of a transconductance amplifier using paralleled current mirror cells.

A simplified diagram of a cell-based transconductance amplifier 12 is illustrated in FIG. 1. A total of ten positive current mirror cells, 14A-14G, connected in parallel, and ten negative current mirror cells, 16A-16G, also connected in parallel, each contribute to provide the total bipolar current at output 18 to load 20. The current gain of each cell is determined by the ratio of two resistors, resistors 44 and 50, (see FIG. 3). A differential voltage to current converter 22 converts an input voltage across terminals 24 to a current that is separated for polarity and steered to the appropriate cell array. This invention differs from prior art in several respects. The paralleled cell approach of the present invention has the advantage of avoiding the need for a special low resistance current shunt and the problems inherent in providing such resistors. The present invention employs inexpensive commercially available resistors in each cell. The overall gain is independent of the number of paralleled cells but the output current capability increases proportionally while the bandwidth remains independent of the number of cells. The overall gain of the transconductance amplifier can be ranged by a single resistor change which does not affect the bandwidth. The present invention has the flexibility to make a very wide ranging transconductance amplifier by switching in or out the appropriate number of current cells depending on the required maximum output current.

A primary application for transconductance amplifier 12 of the present invention is for calibrating high current, wide band current shunts as well as new current meters with increased current and frequency ranges. The importance of this capability will grow since power generation and distribution systems being proposed for future space stations will most likely be operating in the frequency range from 50 kHz to perhaps as high as 1 MHz. Ultimately, the components and instruments used to measure high frequency power will require the means of generating a known stable source of high frequency current to calibrate such equipment.

Differential voltage to current converter 22 converts an input voltage to a current which is polarity separated and steered to each cell array, 14A-14G and 16A-16G. Converter 22 also provides an appropriate low-level of equal input currents to each polarity array at zero input voltage in order to maintain a quiescent operating current in each cell. Biasing each cell with a small quiescent current is usually done for Class B stages as a means to avoid the nonlinearities and attendant crossover distortion when the input signal passes through zero.

A general expression for the total output current of either polarity array 14A-14G and 16A-16G, where $I_n$ is the input current to the nth cell and $K_n$ is the current gain of the nth cell is $$I_{out} = \sum_{n=1}^{10} I_n K_n \quad (1)$$

If all cells have an equal current gain of K, regardless of whether the input current divides equally into each cell, then the overall current gain reduces to $$I_{out}/I_{in} = K. \quad (2)$$

Thus, the overall current gain is independent of the number of cells but the maximum output current is n times the maximum current capability of a single cell.

Figure 2:
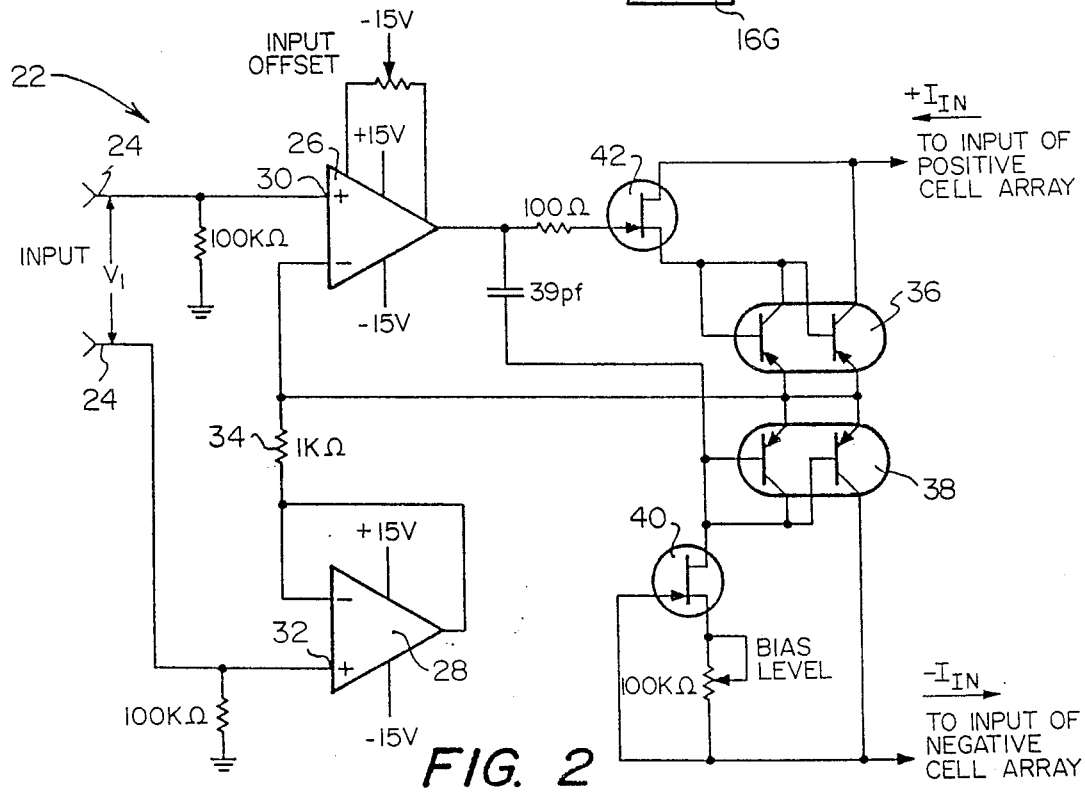
FIG. 2 is a schematic diagram of the voltage to current converter of FIG. 1.

FIG. 2 shows the circuit detail of differential voltage to current converter 12. Two operational amplifiers 26 and 28 are each connected as unity gain amplifiers. Thus, a voltage $V_i$, applied at the input terminals 30 and 32 of amplifiers 26 and 28 respectively, is forced across resistor 34, resulting in a current equal to $V_i/R$, where R is the value of resistor 34. Depending on the polarity of the input voltage, the current through resistor 34 is steered either by integrated circuit 36 out of the positive cell array 14A-14G or by integrated circuit 38 to the negative cell array 16A-16G. Field effect transistor 40 serves as a dc current source to provide a fixed level of equal quiescent current for each cell array. An important feature of this design is the differential input circuit which effectively separates the voltage input terminal from the common side of the output load-current terminal. This feature is essential for interrupting possible ground loops when dealing with high output currents at high frequencies.

The gain of transconductance amplifier 12 is the transconductance gain of converter circuit 22, (1/R) times the fixed current gain of a cell array (K) or $$I_{out}/V_i = (1/R)K. \quad (3)$$

Note that the gain of transconductance amplifier 12 can be conveniently changed by varying resistor 34. Also, the overall frequency response will not be affected by changing resistor 34, provided the voltage swing across resistor 34 is not limited by the slew rate of the circuit.

The performance of transconductance amplifier 12 is dependent on the design of current-mirror cells 14A-14G and 16A-16G. Current gain, frequency response, offset currents, and equivalent output impedance are the important characteristics that must be considered and traded-off in a cell design.

Figure 3:
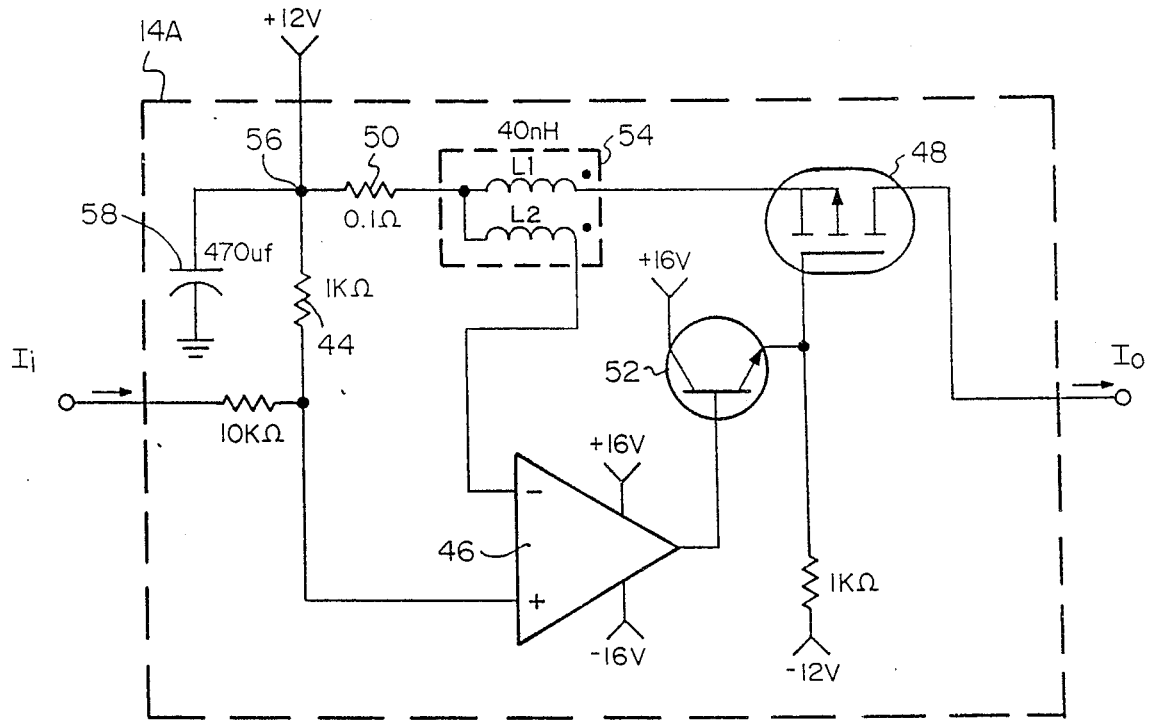
FIG. 3 is a schematic diagram of a positive current mirror cell of FIG. 1.

FIG. 3 shows the basic version of a positive current mirror cell such as cells 14A-14G used in the present invention. Negative cells 16A-16G have the same topography but use complementary devices and reversed power supply voltage polarities. An input current $I_{in}$ causes a voltage drop across a resistor 44, which causes an operational amplifier 46 to turn on the power MOSFET 48. Output current $I_{out}$, through a resistor 50 is regulated when the voltage drop across resistor 50 equals the drop across resistor 44. MOSFET 48 was selected for a seven amp maximum continuous drain current rating. Transistor 52 serves as a buffer for amplifier 46 in order to supply the current necessary to drive the large inter-electrode capacitances associated with MOSFET 48. Transformer 54 in the source circuit provides stability and is designed to set the upper cut-off frequency of the cell's current gain. Output compliance voltage is determined primarily by the supply voltage at node 56 minus the voltage drop across MOSFET 48.

An expression for the current gain of the current-mirror cell, assuming the forward transconductance of MOSFET 48 is constant and neglecting device capacitances, is shown in the equation as $$I_o/I_i = \frac{R_2}{(R1 + j\omega M) + (R1 + 1/G_{fs} + j\omega L1)/A_\omega} \quad (4)$$

where
$M = K(L1 \times L2)^{\frac{1}{2}}$, (L1 and L2 are the inductance values of the coils $L_1$ and $L_2$ of transformer 54)
$A_\omega$ = open loop gain of operational amplifier 26,
$G_{fs}$ = the forward transconductance of MOSFET 48,
$R_1$ = the value of resistor 50,
$R_2$ = the value of resistor 44, and
K = the coupling coefficient of transformer 54, 0.4.

At low frequencies, the current gain reduces simply to $R_2/R_1 = K$. Thus, for the values given in FIG. 3 the current gain is $10^4$. At high frequencies, the first break in the frequency response occurs at $\omega = R_1/M$, provided the second term in the denominator is small with respect to the first term by virtue of sufficient open-loop gain, $A_\omega$. The values of the parameters of transformer 54 and resistor 50 in FIG. 3 were designed to produce a $-3$ dB cut-off frequency of 1 MHz.

The equivalent output impedance, $Z_0$, of the current cell is approximated by [1]

$$Z_0 = Z_{ds} G_{fs} R_1 A_\omega \quad (5)$$

where $Z_{ds}$ is the drain-to-source impedance of MOSFET 48. Equation (5) shows that the output impedance is boosted by the open-loop gain of the operational amplifier. This results in a very high output impedance. At low frequencies, the equivalent output impedance is in the range of several hundred megohms. Unfortunately, however, the output impedance decreases rapidly with increasing frequency due to the fall in amplifier open-loop gain and the decrease in $Z_{ds}$. The drain-to-source capacitance increases rapidly with decreased drain-to-source voltage. Also, the output impedance of transconductance amplifier 12 will be proportionally reduced by the number of paralleled cells.

The output offset currents of the current cell are primarily determined by the offset voltage and input bias currents of operational amplifier 46. Gate current leakage of MOSFET 48 is also a factor but can be neglected. Typically, the input bias current of amplifier 46 will contribute about plus or minus two hundred micro amps to the cell's output offset-current and an additional plus or minus three hundred micro amps is due to input voltage offsets. Multiple cells operating in parallel can reduce the total output offset-current drifts because, statistically, the sources of drift contributed by all the cells tend to be uncorrelated.

In the preferred embodiment, resistor 50 is made up by paralleling ten one ohm, one third watt, metal film resistors. Resistor 44 is also of the same type as resistor 50 so that, ideally, if their temperature coefficient of resistance of each are equal, then the current gain of the cell becomes independent of temperature. In the preferred embodiment, the parameters of transformer 54 are easily implemented as an air-core transformer on a printed circuit board by setting the length, trace width, and spacing of two parallel conductors to obtain the desired mutual inductance. A bypass capacitor 58 for the positive supply voltage is essential to hold the node potential at resistor 44 and 50 constant. In practice, the ground return end of capacitor 58 must be magnetically coupled to the output current lead.

It is important that the inductance of the cables which parallel the cell outputs be equal in order to avoid circulating currents between the cells. Triaxial cable (not shown) can also be used effectively to reduce wiring inductance from each cell to the output terminal by employing the inner and outer shields for the output and return conductors of each cell.

Figure 4:
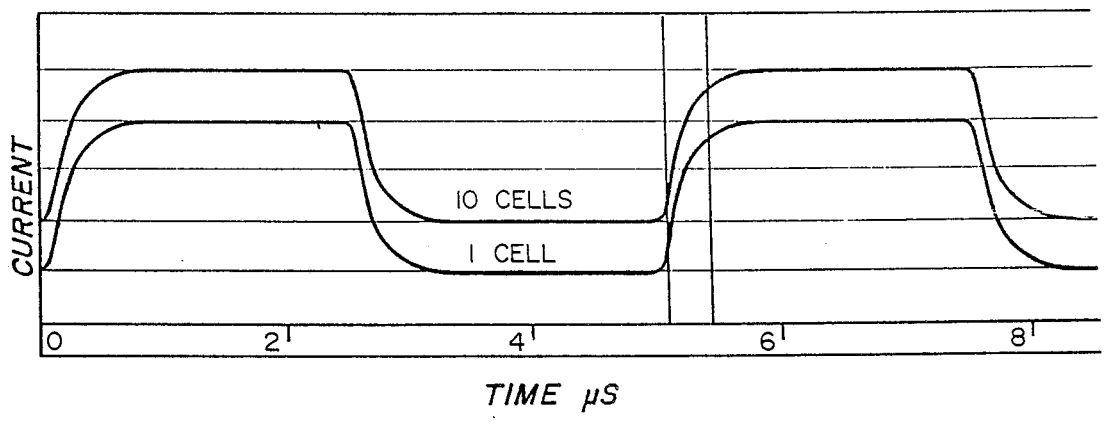
FIG. 4 is a graphical representation of simulated time domain current waveforms.

FIG. 4 shows the output current time-domain simulation for the single cell of FIG. 3 (lower trace) and ten identical cells connected in parallel (upper trace). The single-cell waveform has a peak-to-peak output of three amps and the ten-cell waveform has thirty amp peak-to-peak output. Note that the transition times, about three hundred fifty nano-seconds, are virtually identical, indicating that cell paralleling does not affect bandwidth. Because the current gain of the cell is $10^4$, only three milli-amps is required at the input of the ten-cell array to obtain a thirty amp output.

Figure 5:
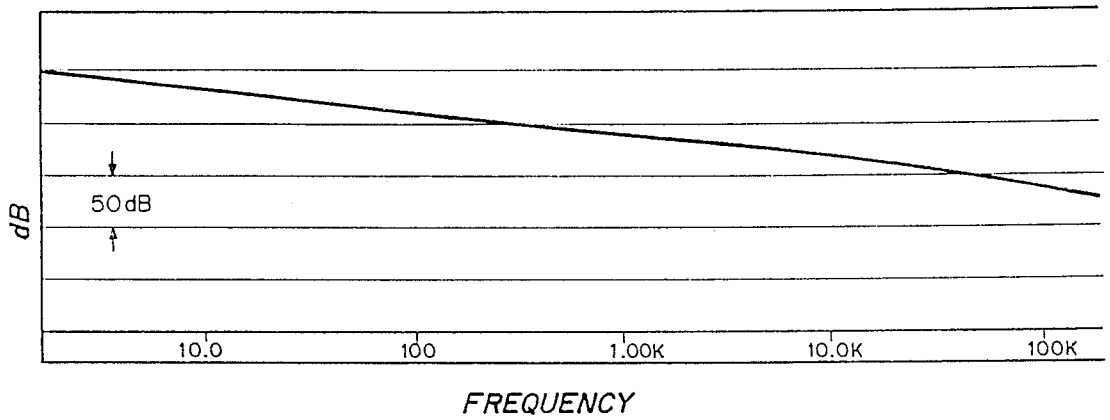
FIG. 5 is a graphical representation of a simulated output impedance of a cell as a function of frequency.

FIG. 5 shows a plot of the equivalent output impedance as a function of frequency of a single current-source cell. The plot was generated from simulation in the frequency domain by applying a test voltage source at the output terminal and measuring the ratio of the applied test voltage to the resulting current. The vertical scale is presented in dB in order to show the decrease in impedance over five decades of frequency. The output impedance is about $10^8$ ohms at 1 Hz and drops about 100 dB at 50k Hz, resulting in a value of about one thousand ohms.

The preferred embodiment of transconductance amplifier 12 uses ten positive current cells 14A–14G and ten negative current cells 16A–16G of the design illustrated in FIG. 3 and differential voltage-to-current converter 22 as shown in FIG. 2. Some of the measured performance characteristics of transconductance amplifier 12 are that the Gain is from 0.5 to 10, in five ranges. The gain temperature coefficient is −25 ppm/°C. The frequency response from dc to 100 kHz is −0.5%, to 750 kHz is −3 dB, both at twenty amps rms. The maximum output is thirty-five amps rms at 100 kHz. The compliance voltage is five volts rms at twenty amps. The output impedance is ten kilo-ohms at 2 kHz. The output offset current is plus or minus one hundred micro-amps. The total harmonic distortion is −40 dB.

The maximum output current of thirty-five amps at 100 kHz indicated in the above list of performance characteristics of the present invention is only due to a compliance voltage limitation in the differential voltage-to-current circuit and the current capability of the power supplies. Amplifier 12 is capable of at least fifty amps rms output before reaching the thermal limitations of the cells.

Total harmonic distortion is an especially important measure of performance for this design. Since each complimentary set of current cells is not within a common feedback loop, differences in response between the two halves, will contribute to harmonic distortion. Table 1 shows the total harmonic distortion at the five and twenty amp rms output-current levels over a frequency range from 50 Hz to 100 kHz. Distortion drops to about −40 dB at 100 kHz at twenty amps rms.

TABLE 1

| | Total Harmonic Distortion | |
|---|---|---|
| Frequency Hz | Distortion @5A rms dB | Distortion @20 A rms dB |
| 50 | −55 | −59 |
| 100 | −59 | −64 |
| 1 K | −59 | −71 |
| 2 K | −59 | −69 |
| 5 K | −59 | −66 |
| 10 K | −58 | −61 |
| 20 K | −56 | −53 |
| 50 K | −47 | −44 |
| 100 K | −42 | −40 |

Figure 6:
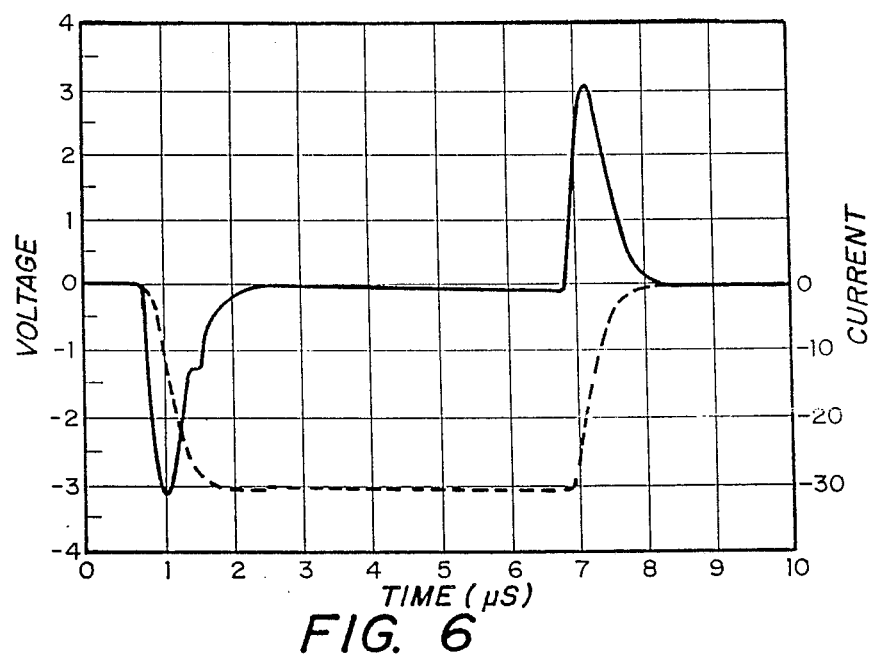
FIG. 6 is a graphical representation of the pulse response of the transconductance amplifier of FIG. 1.

Referring now to FIG. 6, the pulse response of the transconductance amplifier output-current superimposed on the output terminal voltage waveform is illustrated. Measurements were made with a wideband current transformer that has a sensitivity of one tenth volt per amp. The peak output current is thirty amps with rise and fall times of about five hundred nano-seconds. The narrow three volt peak voltage-pulses at the current transitions reflects the voltage required to overcome the parasitic inductance (about fifty nano-henrys) in the output load measuring circuit. Note that even a small amount of inductance in the output circuit requires three volts of compliance from amplifier 12.

The equivalent output impedance of transconductance amplifier 12 determines the load current regulation. The equivalent output impedance can be determined by measuring the change in output current for a known change in load impedance. Table 2 shows the change in the magnitude of current and phase caused by a load change of two tenths of an ohm at five amps.

TABLE 2

| | Load Regulation vs Frequency | | |
|---|---|---|---|
| Frequency Hz | Current change ppm | Phase change Rad | Output impedance |
| 50 | 0 | 31 | — |
| 400 | 0 | 237 | — |
| 1 K | −5 | 602 | 40000 |
| 2 K | −22 | 1192 | 9090 |
| 8 K | −97 | 4847 | 2061 |
| 10 k | −156 | 6355 | 1282 |
| 14 K | −324 | 8290 | 617 |

TABLE 2-continued

| Load Regulation vs Frequency | | | |
|---|---|---|---|
| Frequency Hz | Current change ppm | Phase change Rad | Output impedance |
| 16 K | −610 | 9577 | 327 |
| 20 K | −793 | 11800 | 252 |

The last column in the table shows the calculated equivalent output impedance. The output impedance falls off rapidly with frequency to about two hundred fifty ohms at 20 kHz. The low output impedance at higher frequencies is a result of the negative feedback that was added to make the amplifier unconditionally stable for all loads.

A high-current, very-wide-band transconductance amplifier has been described. The approach is based on paralleling the input and output of complementary unipolar current-mirror cells. The cell approach has the advantage of avoiding the need for a single low-resistance current shunt and the attendant problems inherent in such resistors. It was shown that the bandwidth of the system is independent of the number of current cells. Test results of transconductance amplifier 12 indicate that a bandwidth of 750 kHz and output currents up to thirty-five amps rms at 100 kHz can be achieved.

While the present invention has been described by way of a preferred embodiment, it is to be understood that this is for illustration purposes only and that the present invention should not be limited thereto. To those skilled in the art, many modifications and variations of the present invention are possible in light of the above teachings. It is therefore to be understood that the present invention can be practiced otherwise than as specifically described herein and still be within the spirit and scope of the appended claims.

What is claimed is:

1. A high current transconductance amplifier comprising:
    differential voltage to current converter means for converting an input voltage to a positive current signal and a negative current signal;
    a plurality of positive current mirror cells, said positive mirror cells connected to each other in parallel and connected to said converter on their input side each of which receives a portion of said positive current signal and each of which generates a positive output current signal;
    a plurality of negative current mirror cells, said negative mirror cells connected to each other in parallel and connected to said converter on their input side each of which receives a portion of said negative current signal and each of which produces a negative output current signal; and
    means for connecting each of the positive output current signals from said plurality of positive current mirror cells and each of said negative output current signals from said plurality of negative current mirror cells to add together forming an output current signal delivered to a load.

2. The transconductance amplifier according to claim 1, wherein said differential voltage to current converter includes:
    differential input means for separating an input voltage terminal and an output load current terminal.

3. The transconductance amplifier according to claim 2, wherein said differential input means comprises:
    a first input terminal and a second input terminal across which said input voltage is supplied;
    a first differential amplifier having its positive input connected to said first input terminal;
    a second differential amplifier having its positive input connected to connected to said second input terminal; and
    current amplification means for providing a current signal to said output load current terminal.

4. The high current transconductance amplifier of claim 1, wherein each of said positive current mirror cells and negative current mirror cells comprises:
    an input terminal for receiving an input current signal;
    power supply means;
    first resistor means connected in series with said power supply means and said input terminal;
    operational amplifier means having positive and negative input terminals and an output terminal, said positive input being connected to said first resistor means at the junction of said first resistor means and said input terminal;
    second resistor means connected at one end to said power supply means;
    power MOSFET means connected to said output terminal of said operational amplifier means and having an input and an output;
    transformer means connected in series between the other end of said second resistor means and said power MOSFET means; and
    output terminal means connected to said output of said power MOSFET means.

5. A method for producing a stable high current over a wide bandwidth comprising the steps of:
    converting a voltage input to a positive current signal and a negative current signal using a differential voltage to current converter;
    connecting a plurality of positive current mirror cells to each other in parallel and to said converter on their input side;
    providing a portion of said positive current signal to each of said positive current mirror cells;
    connecting a plurality of negative current mirror cells to each other in parallel and to said converter on their input side;
    providing a portion of said negative current signal to each of said negative current mirror cells; and
    providing an output to a load by connecting outputs from said plurality of positive current mirror cells and said plurality of negative current mirror cells together and to said load.

6. The method according to claim 5, wherein said step of converting said differential voltage to current converter includes:
    isolating said input voltage from said output current by separating an input terminal for receiving said input voltage and an output terminal for providing said output current.

7. The method according to claim 6, wherein said step of isolating said input voltage includes:
    receiving said input voltage across a first input terminal and a second input terminal;
    connecting the positive input of a first differential amplifier to said first input terminal;
    connecting the positive input of a second differential amplifier to said second input terminal; and amplifying outputs of said first differential amplifier and said second differential amplifier to provide a current signal to said output current terminal.

8. An apparatus for producing a stable high current over a wide bandwidth comprising:
   means for converting a differential input voltage to a positive current signal and a negative current signal;
   a plurality of positive current mirror cells connected to each other in parallel and to said converter on their input side each receiving a portion of said positive current signal and each producing a positive output current signal;
   a plurality of negative current mirror cells connected to each other in parallel and to said converter on their input side each receiving a portion of said negative current signal and each producing a negative output current signal; and
   means for providing an output to a load by connecting outputs from said plurality of positive current mirror cells and said plurality of negative current mirror cells together.

9. The apparatus according to claim 8, wherein said means for converting said differential voltage to current includes:
   means for isolating said differential input voltage from said positive current signal and said negative current signal.

10. The apparatus according to claim 9, wherein said means for isolating said input voltage includes:
   a first input terminal and a second input terminal across which said input voltage is received;
   a first differential amplifier connected to said first input terminal;
   a second differential amplifier connected to said second input terminal; and
   means for amplifying outputs of said first differential amplifier and said second differential amplifier to provide said positive current signal and said negative current signal.

11. An apparatus for producing a stable high current over a wide bandwidth comprising:
   means for converting a differential voltage input to an output current with a means for isolating said input voltage from said output current having a first input terminal and a second input terminal across which said input voltage is received, a first differential amplifier connected to said first input terminal, a second differential amplifier connected to said second input terminal and means for amplifying outputs of said first differential amplifier and said second differential amplifier to provide a current signal to an output current terminal;
   a plurality of positive current mirror cells connected each other in parallel and to said means for converting on their input side;
   a plurality of negative current mirror cells connected to each other in parallel and to said means for converting on their input side; and
   means for providing an output to a load by connecting outputs from said plurality of positive current mirror cells and said plurality of negative current mirror cells together.

12. A high current transconductance amplifier comprising:
   differential voltage to current converter means including:
      differential input means for separating an input voltage terminal from an output load current terminal, said differential input means comprising:
         a first input terminal and a second input terminal across which input voltage is supplied;
         a first differential amplifier having its positive input connected to said first input terminal;
         a second differential amplifier having its positive input connected to said second input terminal; and
         current amplification means for providing a current signal to said output load current terminal;
      a plurality of positive current mirror cells, said positive mirror cells connected to each other in parallel and connected to said converter on their input side;
      a plurality of negative current mirror cells, said negative mirror cells connected to each other in parallel and connected to said converter on their input side; and
   means for connecting outputs from said plurality of positive current mirror cells and said plurality of negative current mirror cells together to supply an output to a load.

13. A method for producing a stable high current over a wide bandwidth comprising the steps of:
   converting a voltage input too an output current using a differential voltage to current converter including isolating said input voltage from said output current by separating an input terminal for receiving said input voltage from an output terminal for providing said output current, receiving said input voltage across a first input terminal and a second input terminal, connecting the positive input of a first differential amplifier to said first input terminal, connecting the positive input of a second differential amplifier to said second input terminal, and amplifying outputs of said first differential amplifier and said second differential amplifier to provide a current signal to said output current terminal,
   connecting a plurality of positive current mirror cells to each other in parallel and to said converter on their input side;
   connecting a plurality of negative current mirror cells to each other in parallel and to said converter on their input side; and
   providing an output to a load by connecting outputs from said plurality of positive current mirror cells and said plurality of negative current mirror cells together.

14. An apparatus for producing a stable high current over a wide bandwidth comprising:
   means for converting a differential voltage input to an output current including means for isolating said input voltage from said output current;
   said means for isolating said input voltage including:
      a first input terminal and a second input terminal across which said input voltage is received;
      a first differential amplifier connected to said first input terminal;
      a second differential amplifier connected to said second input terminal; and
      means for amplifying outputs of said first differential amplifier and said second differential amplifier to provide a current signal to an output current terminal;

a plurality of positive current mirror cells connected to each other in parallel and to said converter on their input side;

a plurality of negative current mirror cells connected to each other in parallel and to said converter on their input side; and means for providing an output to a load by connecting outputs from said plurality of positive current mirror cells and said plurality of negative current mirror cells together.

* * * * *